United States Patent [19]

Belohoubek et al.

[11] 3,869,677

[45] Mar. 4, 1975

[54] MICROWAVE TRANSISTOR CARRIER FOR COMMON BASE CLASS A OPERATION

[75] Inventors: Erwin Franz Belohoubek; Adolph Presser, both of Kendall Park, N.J.

[73] Assignee: RCA Corporation, New York, N.Y.

[22] Filed: Oct. 18, 1973

[21] Appl. No.: 407,576

[52] U.S. Cl. .................... 330/31, 330/38 M, 330/56

[51] Int. Cl. .............................................. H03f 3/04

[58] Field of Search ......... 330/21, 31, 38 M, 53, 56; 333/73 S, 84 M

[56] References Cited

UNITED STATES PATENTS

| | | | |
|---|---|---|---|
| 3,569,850 | 3/1971 | Wegener et al. | 330/56 |
| 3,573,675 | 4/1971 | Leonard | 333/73 S |
| 3,577,181 | 5/1971 | Belohoubek | 330/38 M X |
| 3,715,677 | 2/1973 | Vergnolle | 330/38 M X |
| 3,784,883 | 1/1974 | Duncan et al. | 333/84 M X |

FOREIGN PATENTS OR APPLICATIONS

| | | | |
|---|---|---|---|
| 1,516,830 | 10/1969 | Germany | 330/53 |

*Primary Examiner*—James B. Mullins

*Attorney, Agent, or Firm*—Edward J. Norton; Joseph D. Lazar

[57] ABSTRACT

An electrically conductive substrate is adapted to be connected to the ground plane of a transmission line and an input and output are adapted to be electrically connected to the transmission line itself. A transistor having base, emitter and collector contacts is mounted on the substrate, the emitter contact being electrically connected to the input and the collector contact being electrically connected to the output. A capacitor is mounted directly on the substrate and is electrically connected between the transistor base contact and the substrate.

8 Claims, 6 Drawing Figures

MICROWAVE TRANSISTOR CARRIER FOR COMMON BASE CLASS A OPERATION

BACKGROUND OF THE INVENTION

The invention herein disclosed was made in the course of or under a contract or subcontract thereunder with the Department of the Army.

The present invention relates to a transistor carrier for use in a microwave stripline circuit structure, and more particularly to a carrier which includes a capacitor electrically connected between the transistor base contact and ground, thereby permitting common base Class A operation of the transistor from a single, grounded DC voltage source.

Common base Class A operation offers the best linear high gain performance at the upper useful frequency end of microwave transistors. Since the transistor base electrode is grounded in this type of operation, a problem arises in that a DC voltage opposite in polarity and different in level from that applied to the collector, is required for the emitter bias. One method which may be used to overcome the disadvantage of using two separate power supplies is to DC isolate the amplifier circuit ground within its housing. This method, however, has the drawback that it can excite undesirable extraneous waveguide modes in the housing.

A second significant problem also derives from the grounded base configuration. In mounting microwave transistors, the critical transistor lead connection is the one going to ground since the inductance of this lead has a regenerative effect and can cause instability. Normally, the inductance of this lead can be reduced by reducing its length. However, physical considerations set a limit as to how short the leads can be made thereby establishing a lower limit as to the amount the inductance can be mechanically reduced.

SUMMARY OF THE INVENTION

A transistor carrier which is adapted to be mounted in a microwave stripline circuit structure includes an electrically conductive substrate as well as an input and an output. A capacitor is mounted on the substrate with one side electrically connected to the substrate. A transistor is also mounted on the substrate. The transistor has base, emitter and collector electrodes. The collector electrode is electrically connected to the output circuit, the emitter electrode is electrically connected to the input circuit and the base electrode is electrically connected to the other side of the capacitor.

DETAILED DESCRIPTION

Figure 1:
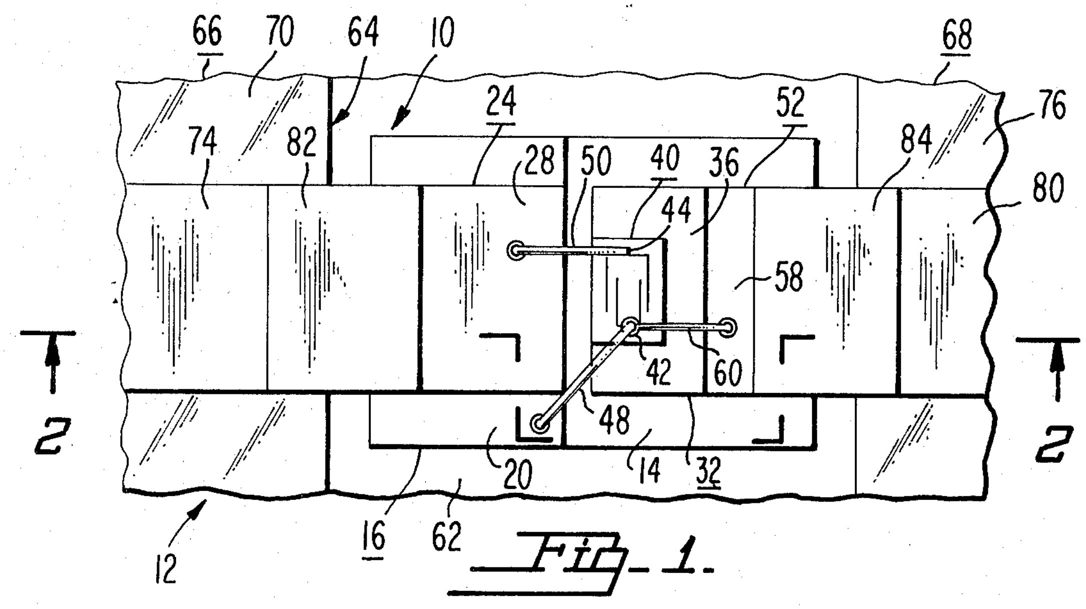
FIG. 1 is a top plan view of a form of the transistor carrier of the present invention in a microwave stripline circuit structure.
Figure 2:
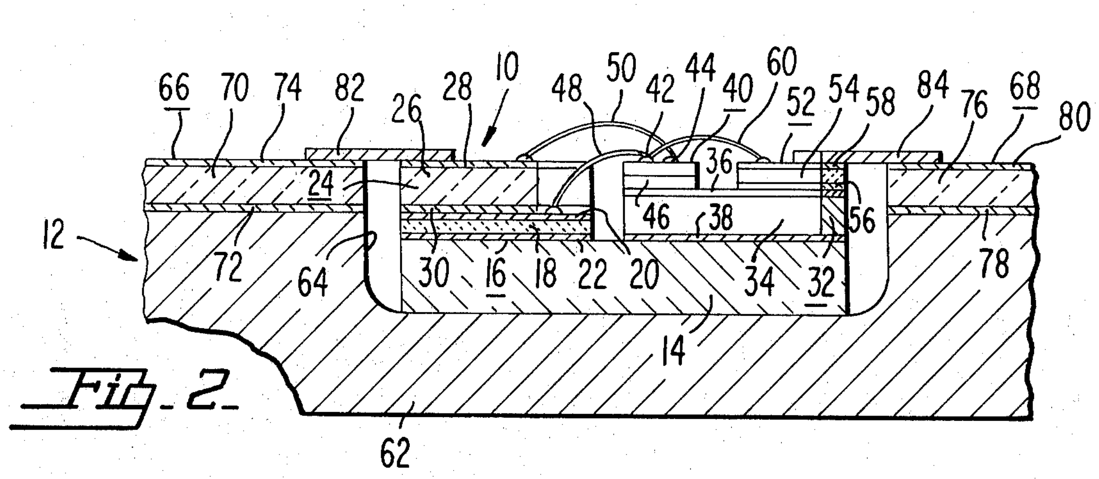
FIG. 2 is a sectional view taken along line 2—2 of FIG. 1.

Referring to FIGS. 1 and 2 of the drawing, there is shown a transistor carrier generally designated as 10, mounted on a microwave stripline circuit structure, generally designated as 12. The transistor carrier 10 comprises a substrate 14 of an electrically conductive metal, such as molybdenym.

A first capacitor 16 is mounted on the substrate 14. The capacitor comprises a flat layer 18 of a dielectric material, such as silicon dioxide and metal films 20 and 22 coated on opposite sides of the dielectric layer 18. One side of the capacitor, the lower metal film 22, is mounted on and electrically and mechanically connected, such as by soldering or brazing, to the substrate 14.

A first transmission line segment 24, forming a part of the input means, is mounted on the upper metal film 20 of the first capacitor 16. The first transmission line segment 24 comprises a flat plate 26 of a material having good dielectric properties, such as a ceramic, and metal layers 28 and 30 coated on the opposed flat surfaces of the plate 26. The metal layers 28 and 30 may be any suitable thin or thick film layer. The first transmission line segment 24 is mounted on the first capacitor 16 with the metal layer 30 contacting and mechanically bonded, such as by soldering or brazing, to the upper metal film 20 of the capacitor.

A second transmission line segment 32, forming a part of the output means, is mounted on the substrate 14. The second transmission line segment 32 comprises a flat plate 34 having good dielectric and heat conducting properties, such as beryllium oxide, and metal layers 36 and 38 coated on the opposed flat surfaces of the plate 34. The second transmission line segment 32 is mounted on the substrate 14 with the metal layer 38 contacting and mechanically bonded to the substrate 14.

A transistor 40 is mounted on the upper metal layer 36 of the second transmission line segment 32. The transistor 40 has base and emitter electrodes 42 and 44 respectively on the top surface thereof and a metal film 46 on the bottom surface thereof which serves as a collector electrode. The collector electrode 46 is soldered to that portion of the output means comprising the upper metal layer 36 of the second transmission line segment 32, so as to be mechanically and electrically connected thereto. The base electrode 42 is electrically connected to the other side of the first capacitor 16, the upper metal film 20, by a base lead 48. The emitter electrode 44 is electrically connected to that portion of the input means comprising the metal layer 28 of the first transmission line segment 24, by emitter lead 50.

A second capacitor 52 is mounted on the upper metal layer 36 of the second transmission line segment 32 adjacent the transistor 40. The second capacitor comprises a flat layer 54 of a dielectric material, such as silicon dioxide, and metal films 56 and 58 coated on opposite sides of the dielectric layer 54. One side of the second capacitor, the metal film 56, is seated on and soldered to the upper metal layer 36 of the second transmission line segment. An impedance element, such as a wire 60, is connected between the other side of the second capacitor, the metal film 58, and the base electrode 42 of the transistor 40. Since the upper metal layer 36 of the second transmission line segment 32 is electrically connected to the collector electrode 46 of the transistor 40, the wire 60 and the second capacitor 52 form a series connected inductance-capacitance network which is in turn electrically connected between the base electrode 42 and collector electrode 46 of the transistor 40.

The stripline circuit structure 12 comprises a metal plate 62 having a recess 64 in the top surface thereof. The recess 64 is slightly longer than the length of the substrate 14 of the transistor carrier 10. An input circuit portion 66 is mounted on the top surface of the plate 62 at one end of the recess 64 and an output portion 68 is mounted on the top surface of the plate 62 at the other end of the recess 64. The input circuit portion 66 comprises a flat plate 70 of an electrical insulating material, such as a ceramic, coated on its opposed flat surfaces with metal layers 72 and 74. The metal layer 72 is bonded, such as by soldering or brazing, to the metal plate 62. The output circuit portion 68 also comprises a flat plate 76 of an electrical insulating material, such as a ceramic, coated on its opposed flat surfaces with metal layers 78 and 80. The metal layer 78 is bonded to the metal plate 62.

The transistor carrier 10 is mounted in the recess 64 in the stripline circuit structure plate 62 with the first transmission line segment 24 being adjacent to but slightly spaced from the input circuit portion 66 and the second transmission line segment 32 being adjacent to but slightly spaced from the output circuit portion 68. The insulating plates 70 and 76 of the input and output circuit portions 66 and 68 respectively are each of a thickness such that the metal layer 74 on the input circuit portion 66 is substantially coplanar with the metal layer 28 on the first transmission line segment 24 and the metal layer 80 of the output circuit portion 68 is substantially coplanar with the upper metal film 58 of the second capacitor 52. A metal connecting strip 82, forming a part of the input means, extends across the gap between the input circuit portion 66 and the first transmission line segment 24 and is bonded at its ends to the metal layers 74 and 28. Another metal connecting strip 84, forming a part of the output means, extends across the gap between the output circuit portion 68 and the second capacitor 52 and is bonded at one end to one side of the second capacitor, the upper metal film 58, and at the other end to metal layer 80 of the output circuit portion 68. Since the other side of the second capacitor 52, the lower metal film 56, is electrically connected to the collector electrode 46 of the transistor 40 by means of the upper metal layer 36 of the second transmission line segment 32, the second capacitor 52 is electrically connected between that portion of the output means comprising the metal connecting strip 84 and the collector electrode 46 of the transistor 40.

In the stripline circuit structure 12, the plate 62 serves as the ground plane, the metal layer 74 of the input portion 66 as the input line and the metal layer 80 of the output portion 68 as the output line. Since the substrate 14 of the transistor carrier 10 is mounted directly on the plate 62 and the lower metal film 22 of the first capacitor 16 is mounted directly on the substrate 14 while the other metal film 20 is connected to the base electrode 42 of the transistor 46 by the base lead 48, the base of the transistor is connected to ground through the first capacitor 16. The input line 74 of the stripline circuit structure is connected to the emitter 44 of the transistor 40 through the connecting strip 82, metal layer 28 of the first transmission line segment 24 and emitter lead 50. The collector 46 of the transistor 40 is connected to the lower metal film 56 of the second capacitor 52 through the upper metal layer 36 of the second transmission line segment 32. Since the upper metal film 58 of the second capacitor 52 is connected to the output line 80 of the stripline circuit structure through the connecting strip 84, the collector 46 of the transistor 40 is connected to the stripline circuit structure output through the series-connected second transmission line segment 32 and the second capacitor 52.

Figure 3:
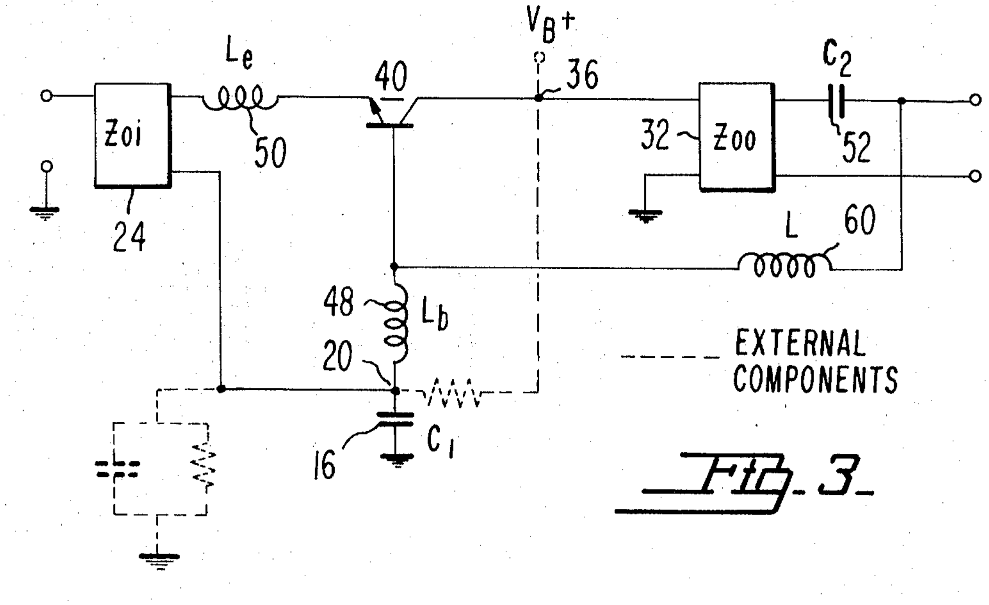
FIG. 3 is a schematic circuit diagram of the transistor carrier of the present invention as represented by FIGS. 1 and 2.

Referring to FIG. 3, there is shown the schematic circuit diagram of the transistor carrier 10. The blocks $Z_{oi}$ and $Z_{oo}$ represent the first and second transmission line segments 24 and 32 respectively. The inductance $L_e$ is the inductance of the emitter lead 50 and the inductance $L_b$ is the inductance of the base lead 48. The capacitance $C_1$ is the capacitance of the first capacitor 16. This capacitor serves to DC isolate the base electrode 42 from ground thereby permitting, in conjunction with an external voltage divider network, the use of a single grounded DC power supply to provide the bias voltages required for common base Class A operation. The segments shown in broken lines represent a typical external voltage divider network arrangement, the components of which can be electrically connected to the transistor carrier at the upper metal layer 36 of the second transmission line segment 32 and the upper metal film 20 of the first capacitor 16. Also, as shown in this typical arrangement, the external voltage, $V_{B+}$, can be applied to the upper metal layer 36 of the second transmission line segment which in turn is electrically connected to the collector electrode 46 of the transistor 40.

The inductance $L_b$ is the inductance of the base lead 48 which connects the base electrode 42 of the transistor 40 to the first capacitor 16. The inductance $L_b$ of the base lead 48 together with the capacitance $C_1$ of the first capacitor 16 form a series resonance circuit which permits the inductance of the base lead 48 to be compensated for at a given frequency by proper selection of the value of capacitance $C_1$. Since the Q of this series resonance is very low, the parasitic effect of the inductance of the base lead 48 can be practically eliminated over a wide frequency range.

The capacitance $C_2$ is the capacitance of the second capacitor 52. This capacitor serves to DC isolate the collector of the transistor 40 from the output line 80 thereby enabling a DC voltage to be applied to the collector without appearing on the output line. L is the inductance of the impedance element 60. The inductance L can be adjusted by the size of the wire 60 so that the series-connected second capacitor 52 and impedance element 60 provide, with the internal base-to-collector capacitance of the transistor 40, a parallel resonance circuit. This parallel resonance circuit serves to compensate the collector-to-base capacitance of the transistor 40 to obtain maximum power output from the transistor.

Thus, the transistor carrier 10 of the present invention having a base circuit DC isolation capacitor and a compensating circuit directly on the carrier adjacent the transistor not only permits operation of the transistor in the Class A common base configuration using a single grounded DC power supply but also provides the desired compensation to minimize the parasitic effect of the transistor base lead inductance and achieve maximum power output without substantially reducing the bandwidth capability of the circuit.

Figure 4:
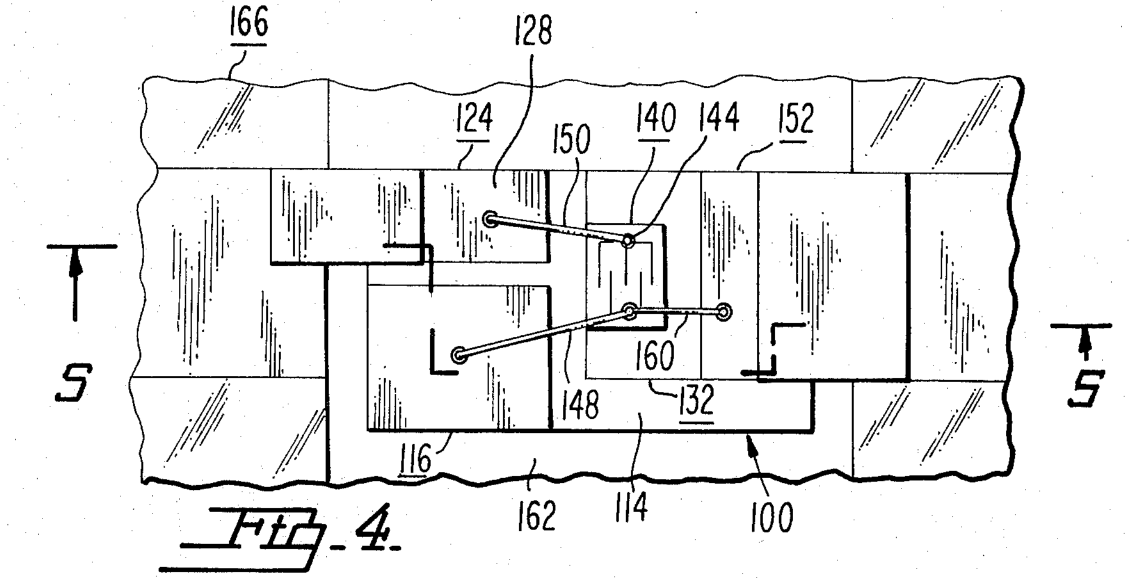
FIG. 4 is a top plan view of an alternate configuration of the transistor carrier of the present invention in a microwave stripline circuit structure.
Figure 5:
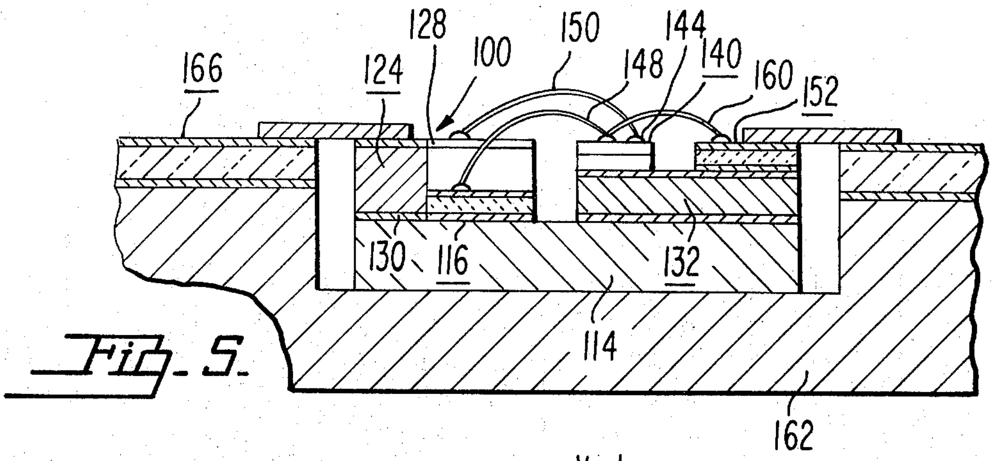
FIG. 5 is a sectional view taken along line 5—5 of FIG. 4.
Figure 6:
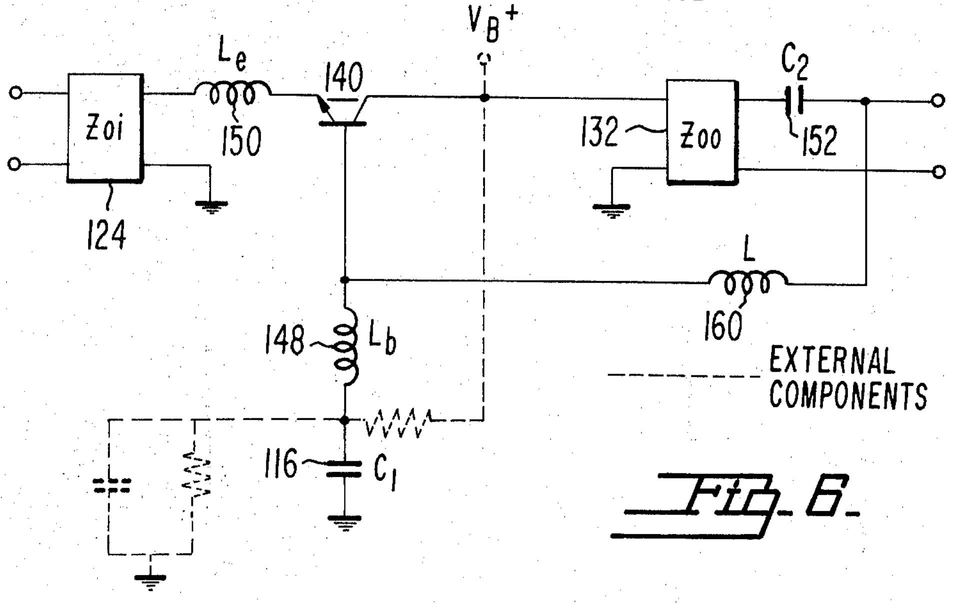
FIG. 6 is a schematic circuit diagram of the alternate configuration of the transistor carrier of the present invention as represented by FIGS. 4 and 5.

Although the transistor carrier 10 is shown and has been described with the first transmission line segment 24, mounted on the upper metal film 20 of the first capacitor 16, the carrier may also be constructed as shown in FIGS. 4 and 5 with that portion of the input means comprising the first transmission line segment 124, being mounted directly on the substrate 114 adjacent to the first capacitor 116 with the lower metal layer 130 of the first transmission line segment 124 contacting and mechanically bonded to the substrate 114, the upper metal layer 128 remaining electrically connected to the emitter electrode 144 of the transistor 140. FIG. 6 is the schematic circuit diagram of the alternate configuration. As shown in FIG. 6, the first transmission line segment 124, as represented by $Z_{oi}$ is connected directly to ground instead of being grounded through capacitance $C_1$ as shown in FIG. 3. Since at microwave frequencies the capacitance $C_1$ is essentially equivalent to a short circuit, the net effect of the two configurations is the same.

We claim:

1. A transistor carrier adapted to be mounted in a microwave stripline circuit operable at a given frequency comprising:

an electrically conductive substrate, an input means, an output means a capacitor mounted on said substrate and having one side electrically connected to said substrate, a transistor mounted on said substrate, said transistor including base, emitter and collector electrodes, the collector electrode being electrically connected to the output means, the emitter electrode being electrically connected to the input means and the base electrode being electrically connected to the other side of the said capacitor by a base lead having an inductance, said base lead and said capacitor being series resonant at said given frequency.

2. A transistor carrier in accordance with claim 1 in which the capacitor is a layer of a dielectric material having metal films on opposed surfaces of the dielectric layer, one metal film being mounted on and bonded to the said substrate.

3. A transistor carrier in accordance with claim 2 in which the input means comprises a transmission line segment mounted on the other metal film of said capacitor, such segment including a metal layer and a dielectric member spacing the metal layer from the said metal film.

4. A transistor carrier in accordance with claim 2 in which the input means comprises a transmission line segment mounted directly on the said substrate adjacent to the said capacitor, such segment including a metal layer and a dielectric member spacing the metal layer from the substrate.

5. A transistor carrier in accordance with claim 1 in which an inductance-capacitance compensating network is mounted on said substrate adjacent said transistor, said compensating network being electrically connected between the base electrode and the collector electrode of the transistor and forming a parallel resonance circuit which includes the base-to-collector internal capacitance of the transistor to compensate for such internal capacitance.

6. A transistor carrier in accordance with claim 5 in which the compensating network comprises a capacitor electrically in series with an inductance element.

7. A transistor carrier in accordance with claim 6 in which the compensating network capacitor is electrically connected between the collector electrode of the transistor and the output means.

8. A transistor carrier in accordance with claim 7 in which the transistor and compensating network capacitor are mounted on a transmission line segment which segment is itself mounted on the substrate, said segment including a metal layer and a dielectric member spacing the metal layer from the substrate.

* * * * *